United States Patent
Jo

(10) Patent No.: US 7,327,625 B2
(45) Date of Patent: *Feb. 5, 2008

(54) VOLATILE MEMORY DEVICES WITH AUTO-REFRESH COMMAND UNIT AND CIRCUIT FOR CONTROLLING AUTO-REFRESH OPERATION THEREOF AND RELATED MEMORY SYSTEMS AND OPERATING METHODS

(75) Inventor: Seong-Kue Jo, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 170 days.

This patent is subject to a terminal disclaimer.

(21) Appl. No.: 11/194,242

(22) Filed: Aug. 1, 2005

(65) Prior Publication Data

US 2006/0098510 A1 May 11, 2006

(30) Foreign Application Priority Data

Nov. 5, 2004 (KR) .................. 10-2004-0089950

(51) Int. Cl.
*G11C 7/00* (2006.01)
(52) U.S. Cl. .................. 365/222; 365/230.03; 365/233
(58) Field of Classification Search ................ 365/233, 365/230.03
See application file for complete search history.

(56) References Cited

U.S. PATENT DOCUMENTS

| | | | | |
|---|---|---|---|---|
| 6,711,082 B1* | 3/2004 | Loffler | ................ | 365/222 |
| 6,751,143 B2* | 6/2004 | Morgan et al. | ............ | 365/222 |
| 7,095,669 B2* | 8/2006 | Oh | ........................ | 365/222 |

FOREIGN PATENT DOCUMENTS

| | | |
|---|---|---|
| JP | 11-066842 | 9/1999 |
| JP | 2000-149550 | 5/2000 |
| JP | 2000-260180 | 9/2000 |
| KR | 1020010040049 | 5/2001 |

* cited by examiner

*Primary Examiner*—David Lam
(74) *Attorney, Agent, or Firm*—Myers Bigel Sibley & Sajovec

(57) ABSTRACT

Methods for automatically refreshing a plurality of memory cells in a volatile memory device are provided in which an auto-refresh mode of the volatile memory device is activated in response to an auto-refresh mode activation command. Thereafter, an auto-refresh operation may be performed on the plurality of memory cells in response to an auto-refresh command. Related dynamic random access memory devices, memory systems and logic embedded memories are also provided.

30 Claims, 4 Drawing Sheets

VOLATILE MEMORY DEVICES WITH AUTO-REFRESH COMMAND UNIT AND CIRCUIT FOR CONTROLLING AUTO-REFRESH OPERATION THEREOF AND RELATED MEMORY SYSTEMS AND OPERATING METHODS

CLAIM OF PRIORITY

This application claims priority under 35 U.S.C. § 119 from Korean Patent Application No. 2004-89950, filed on Nov. 5, 2004, the disclosure of which is hereby incorporated by reference herein as if set forth in its entirety.

FIELD OF THE INVENTION

The present invention relates to semiconductor memory devices, and more particularly, to volatile semiconductor memory devices that operate with an auto-refresh function.

BACKGROUND OF THE INVENTION

As is well known to those of skill in the art, data stored in a volatile memory cell such as a dynamic random access memory (DRAM) cell may be lost over time. In particular, the memory cell stores a signal level (such as a voltage level) that represents the value of the data stored in the cell. For example, a source voltage level may, in certain volatile memory devices, represent a data value of logic '1' and a ground voltage level may represent a data value of logic '0'. Unfortunately, a well-known memory-cell leakage phenomenon may cause the stored signal level to degrade over time. Unless corrective action is taken, the stored signal level may eventually degrade such that it represents a data value that is different from the data value that was originally stored in the memory cell. For example, if the stored signal level is not suitably maintained, a source voltage level (logic '1') may, with the passage of time, be lowered sufficiently to reach a ground voltage level (logic '0').

In order to maintain the stored signal level, an integrated circuit that contains one or more volatile memory cells may periodically perform a refresh operation. During a general refresh cycle in a volatile memory device, the sense amplifier reads the data stored in a memory cell, amplifies the read signal level to a desired value and then stores (rewrites) the resulting signal level back into the memory cell.

During normal operation of an integrated circuit that includes a volatile memory cell, the electronic system that includes the integrated circuit periodically generates an auto-refresh command that initiates the refresh operation on the volatile memory cell. The integrated circuit may include a refresh address counter (or an address generator) that is used to specify, for example, the rows of memory cells that are to be refreshed. In response to the auto-refresh command, the integrated circuit performs an auto-refresh operation. During the auto-refresh operation, the integrated circuit may, for example, refresh memory cells of the addressed row and then increase or decrease a counter value by 1 so that the next auto-refresh operation will refresh the memory cells of the next row. After all the rows are refreshed, the counter may be re-initialized so that the integrated circuit can repeat the refresh process. It will be appreciated that more or less than one row of memory cells may be refreshed at one time, and the other methods may be used for selecting the memory cells that are to be refreshed as part of a particular refresh operation.

The period of time that it takes to refresh all of the memory cells in the volatile memory may be selected to ensure that data is not lost from the memory cells due to the above-described degradation of stored signal levels that may occur in volatile memory devices. For example, an integrated circuit that includes 4096 rows of memory cells may, for example, refresh each memory cell at least once every 64 milliseconds. Thus, in order to refresh all of the rows of memory cells in this particular integrated circuit, the electronic system performs at least 4096 auto-refresh operations every 64 milliseconds.

Conventionally, the electric system that periodically generates the auto-refresh commands does so using software-based auto-refresh control logic. The inclusion of such logic in the electronic system causes an increase in the software/hardware loads of the electronic system.

SUMMARY OF THE INVENTION

Pursuant to embodiments of the present invention, methods for refreshing a plurality of memory cells in a volatile memory device are provided. Pursuant to these methods, an auto-refresh mode of the volatile memory device may be activated in response to an auto-refresh mode activation command. Thereafter, an auto-refresh operation may be performed on the plurality of memory cells in response to an auto-refresh command. In these methods, the auto-refresh operation may only be performed in response to the auto-refresh command if the auto-refresh mode is set when the auto-refresh command is received.

The auto-refresh mode activation command and the auto-refresh command may be received from a second memory device. In addition, the methods may also include sending an occupation request for a bus from the second memory device to a host device. The auto-refresh mode activation command and the auto-refresh command may be generated within the second memory device. In such embodiments of the present invention, the auto-refresh mode activation command and the auto-refresh command may be forwarded from the second memory device to the volatile memory device via the bus.

In certain embodiments of these methods, the auto-refresh mode activation command may be forwarded from the second memory device to a mode detector of the volatile memory device. Likewise, the auto-refresh command may be forwarded from the second memory device to a command decoder of the volatile memory device. A first control signal may be activated that indicates that the auto-refresh mode is set in response to receipt by the mode detector of the auto-refresh mode activation command. Thereafter, the command decoder may initiate the auto-refresh operation in response to receipt of the first control signal and activation of the auto-refresh command.

The methods may also include determining when to forward the auto-refresh mode activation command from the second memory device to the volatile memory device based at least in part on auto-refresh timing information stored in a plurality of nonvolatile memory cells of the second memory device. In certain embodiments, the auto-refresh command is forwarded from the second memory device to the volatile memory device after the auto-refresh mode activation command is forwarded from the second memory device to the volatile memory device. In certain embodiments of the above-described methods, the auto-refresh mode of the volatile memory device may be deactivated in response to completion of the auto-refresh operation.

Pursuant to further embodiments of the present invention, memory systems are provided which include a first memory device that has a memory cell array and a first circuit that is configured to initiate an auto-refresh operation on memory cells of the memory cell array. The memory systems further include an auto refresh control circuit that is configured to generate an auto-refresh mode activation command that is provided to the first memory device. The first circuit may comprise a command decoder that is configured to initiate the auto-refresh operation in response to an auto-refresh command if the auto-refresh mode is set. In these systems, the first memory device may also include a mode detector that is configured to set an auto-refresh mode of the first memory in response to receipt of the auto-refresh mode activation command.

In certain embodiments of these memory systems, the auto-refresh control circuit may be part of a second memory device that further includes a nonvolatile memory array that stores information relating to the auto-refresh operation and a timing signal generator. The auto-refresh control circuit may also be configured to generate the auto-refresh command. The above-described memory systems may be operated in combination with a host and a bus that carries information between the host, the first memory and the second memory device. In such combination systems, the second memory device may send a bus occupation request to the host prior to forwarding the auto-refresh mode activation command to the first memory device. The second memory device may sequentially generate the auto-refresh mode activation command and the auto-refresh command upon receiving an acknowledgement to the bus occupation request.

In certain of these memory systems, the mode detector may be configured to set the auto-refresh mode by activating a first control signal in response to receipt of the auto-refresh mode activation command. The first memory device may also be configured to exit the auto-refresh mode after completion of the auto-refresh operation. The command decoder may remain responsive to read and write commands forwarded from the host, but may respond to an auto-refresh command only if the auto-refresh mode is set.

In certain of these memory systems, the first memory device may be a dynamic random access memory and the auto refresh control circuit may be part of a second memory device that includes an array of nonvolatile memory cells.

Pursuant to further embodiments of the present invention, dynamic random access memory ("DRAM") devices are provided which include an auto-refresh control unit that is configured to set an auto-refresh mode of the dynamic random access memory device in response to an auto-refresh mode activation command and to activate an auto-refresh enable signal in response to an auto-refresh command and the setting of an auto-refresh mode. These DRAM devices further include a memory core that is configured to perform an auto-refresh operation in response to the auto-refresh enable signal. In these DRAM devices, the auto-refresh control unit may include a mode detector that is configured to activate a first control signal in response to the auto-refresh mode activation command and a command decoder that generates the auto-refresh enable signal in response to the auto-refresh command only if the first control signal is activated.

Pursuant to still further embodiments of the present invention, methods for operating a memory system that includes a first memory device, a second memory device and a host are provided. Pursuant to these methods, an auto-refresh mode activation command is forwarded from the second memory device to the first memory device. An auto-refresh mode of the first memory device may then be set in response to receipt of the auto-refresh mode activation command. An auto-refresh command is forwarded from the second memory device to the first memory device. In these methods, an auto-refresh operation may be performed on memory cells of the first memory device if the auto-refresh mode of the first memory device is set in response to receipt of the auto-refresh command.

Pursuant to additional embodiments of the present invention, methods for operating a memory system that includes a first memory, a second memory and a host are provided. Pursuant to these methods, the second memory determines that an auto-refresh operation should be performed on the first memory. Thereafter, a bus occupation request is sent from the second memory to the host. A mode setting command and a mode setting value are forwarded from the second memory to the first memory after the bus occupation request is acknowledged. Them, an auto-refresh mode of the first memory is set according to the mode setting command and the mode setting value. Then, after an auto-refresh command is forwarded from the second memory to the first memory, the auto-refresh command is executed at the first memory.

Pursuant to still further embodiments of the present invention, logic embedded memories are provided that include an oscillator, an auto-refresh controller that is configured to determine based on at least an oscillation signal from the oscillator if an auto-refresh operation should be performed on a second memory device and an interface to a host that is configured to forward a bus occupation request from the auto-refresh controller to the host and to forward a bus occupation request acknowledgment from the host to the auto-refresh controller. In these logic embedded memories, the auto-refresh controller may be configured to generate an auto-refresh mode setting command and an auto-refresh command. The logic-embedded memories may also include a non-volatile memory that stores information relating to the timing of the auto-refresh operations of the second memory device that is used by the auto-refresh controller in determining if an auto-refresh operation should be performed on the second memory device.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF THE INVENTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments of the present invention are also described herein with reference to flowchart illustrations and/or block diagrams of methods and systems according to embodiments of the invention. It will be understood that various blocks of the flowchart illustrations and/or block diagrams (and combinations of blocks) can be implemented as an entirely hardware embodiment, an entirely software embodiment or an embodiment combining software and hardware aspects (all generally referred to herein as a "circuit") that implement the function/act specified in the flowchart and/or block diagram block or blocks.

Figure 1:
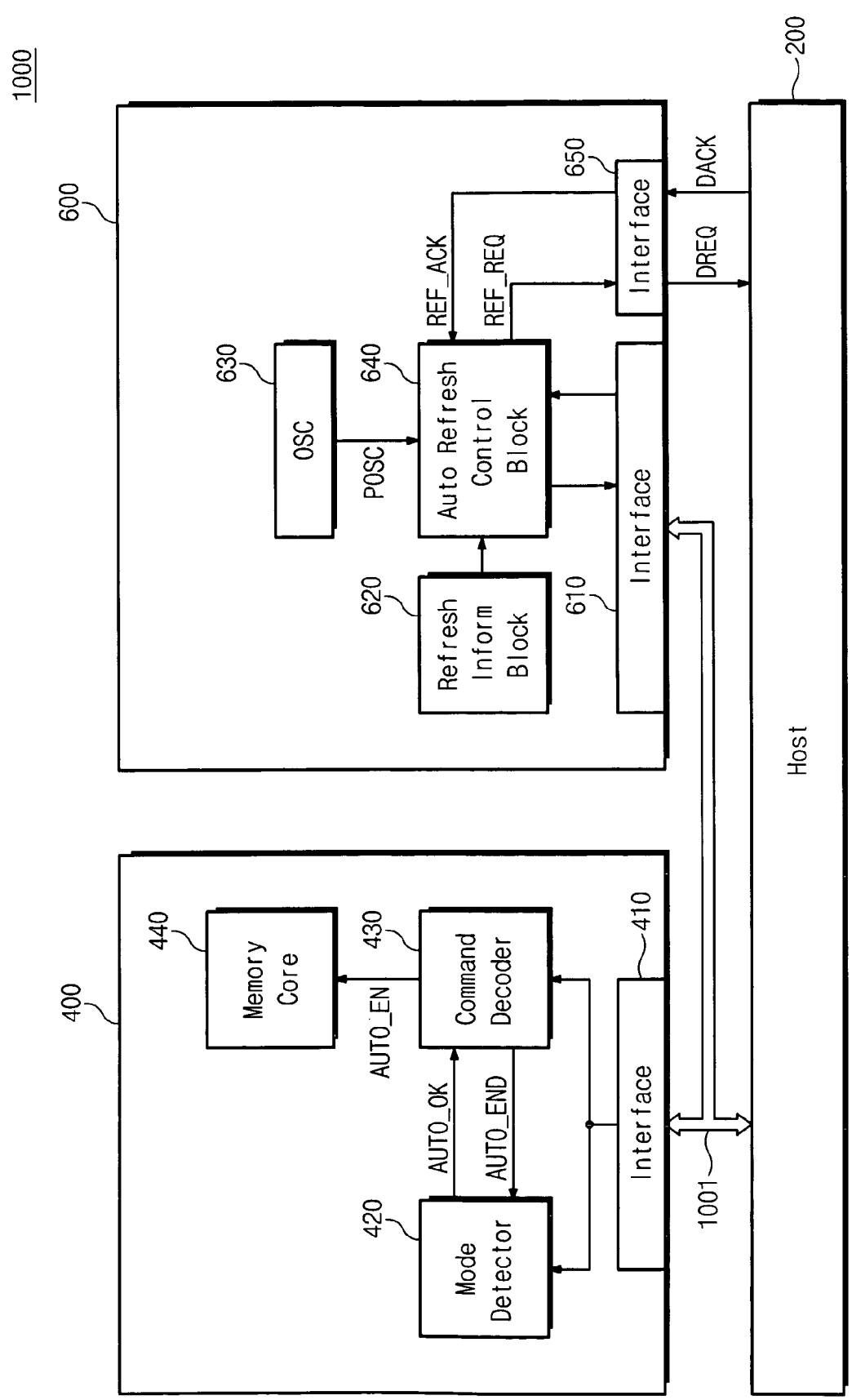
FIG. 1 is a schematic block diagram of a memory system according to embodiments of the present invention.

FIG. 1 is a schematic block diagram of a memory system according to embodiments of the present invention. As shown in FIG. 1, the memory system 1000 may include a host 200 (which may also be referred to as a "chipset"), a first memory 400, and a second memory 600. In the particular embodiment depicted in FIG. 1, the first memory 400 is a dynamic random access memory (DRAM), and the second memory is a nonvolatile memory such as, for example, a NAND flash memory. The first and second memories 400 and 600 may be embodied in a multi-chip package (MCP), or in separate integrated circuits. It will also be apparent to those skilled in the art that numerous other constructions are possible and that FIG. 1 is only intended to depict an exemplary embodiment of a memory system according to the present invention.

As shown in FIG. 1, the first memory 400 may be connected through a bus 1001 to the host 200 and to the second memory 600. The bus 1001 may include a plurality of control signal lines (e.g., /CS, /CAS, /RAS, /WE, CKE, and the like), address signal lines, and data signal lines. The first memory 400 may include, for example, an interface 410, a mode detector 420, a command decoder 430, and a memory core 440. The interface 410 receives information (such as, for example, a command, an address, data, and so forth) that is transferred through the bus 1001, and provides the received information to the mode detector 420, the command decoder 430 and/or other components of the first memory 400. The mode detector 420 stores a mode setting value (which may be used for setting an auto-refresh mode) that is provided, for example, through the interface 410. In certain embodiments of the present invention, the mode detector 420 may store such a mode setting value in response to a mode setting command (also referred to herein as an "auto-refresh mode activation command") that sets the auto-refresh mode, and may further activate a control signal AUTO_OK. The mode setting value may be provided, for example, through address pins or through data pins. As is well known to those skilled in the art, the mode setting command may be expressed through a combination of control signals such as, for example, the /CS, /RAS, /CAS and /WE control signals. In one specific embodiment, the mode setting command may be implemented by setting the /CS, /RAS, /CAS, and /WE control signals to a low state.

As is also shown in FIG. 1, the command decoder 430 may operate in response to the control signal AUTO_OK that is provided from the mode detector 420. The command decoder 430 may be used to decode commands that are input to the memory 400 through, for example, the interface 410. For example, in certain embodiments of the present invention, when the control signal AUTO_OK is activated, the command decoder 430 activates an auto-refresh enable signal AUTO_EN in response to an auto-refresh command that is input through the interface 410. As will be described in more detail herein, when the auto-refresh enable signal AUTO_EN is activated, memory cells of one or more rows in the memory core 440 are refreshed. If the control signal AUTO_OK is deactivated, the command decoder 430 will not activate the auto-refresh enable signal AUTO_EN, even if the auto-refresh command is input through the interface 410. Thus, the command decoder 430 activates the auto-refresh enable signal AUTO_EN in response to an auto-refresh command only if the control signal AUTO_OK is activated. As is also shown in FIG. 1, the command decoder 430 may activate a control signal AUTO_END upon completion of an au to-refresh operation. When the control signal AUTO_END is deactivated, the information stored in the mode detector 420 may be re-initialized.

In the embodiment depicted in FIG. 1, when commands other than the auto-refresh command such as, for example, an active command, read/write commands, a self-refresh command, and the like, are input through the interface 410, the command decoder 430 will process the input command normally irrespective of the state (i.e., activated or deactivated) of the control signal AUTO_OK.

Figure 2:
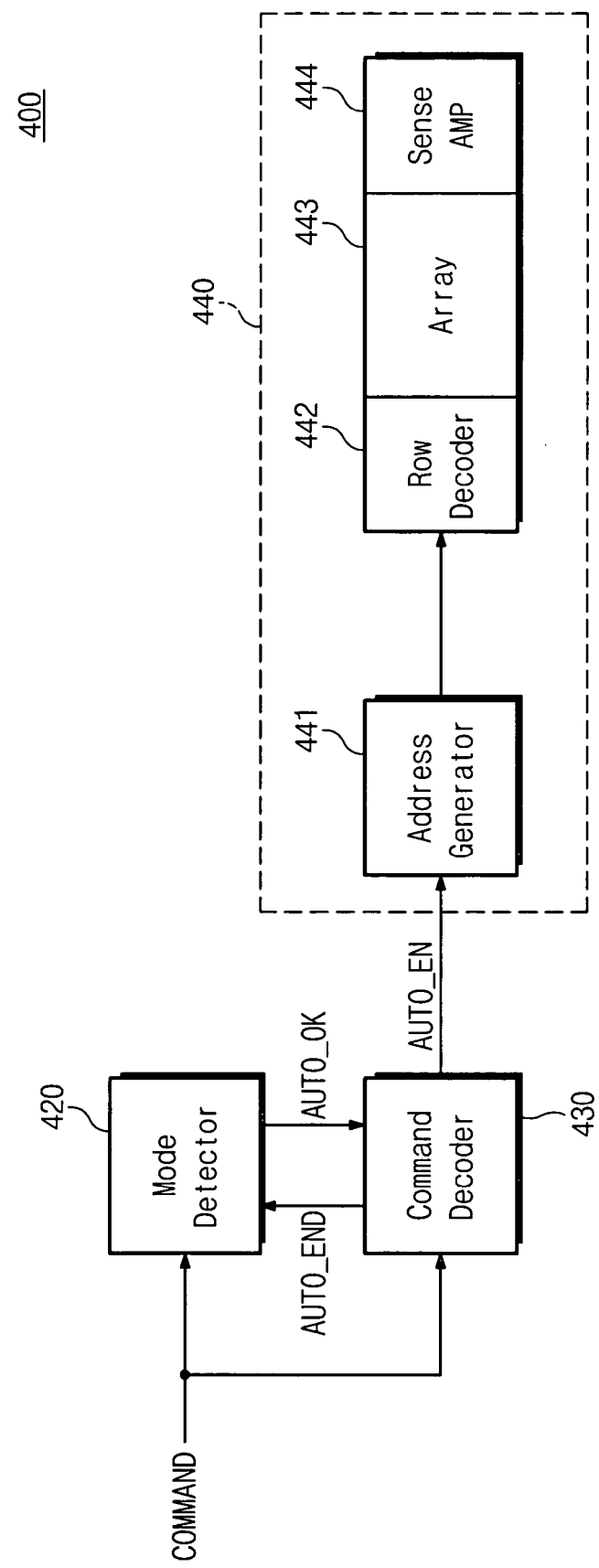
FIG. 2 is a schematic block diagram of the first memory depicted in FIG. 1 according to embodiments of the present invention.

As shown in FIG. 2, in certain embodiments of the present invention, the memory core 440 of the first memory 400 may include an address generator 441, a row decoder (selector) 442, a memory cell array 443, and a sense amplifier 444. The address generator 441 may be used to increase (or decrease) a row address by 1 in response to activation of the auto-refresh enable signal AUTO_EN. The row decoder 442 may be used to select one or more rows among the rows of the memory cell array 443 in response to a row address (or a refresh address) generated by the address generator 441. The sense amplifier 444 (which may be an array of sense amplifiers) may be used to read data from memory cells of the selected rows, and to rewrite the read data to the memory cells of the selected rows without outputting the data to the external circuit. In this manner, the memory cells of the selected rows may be refreshed. Although not shown in the accompanying drawings, it should be apparent to those skilled in the art that well-known components such as, for example, I/O circuits, a row select circuit, and the like may also be provided in the memory core 440.

Referring back to FIG. 1, the second memory 600 is connected through the bus 1001 to the first memory 400. In the embodiment depicted in FIG. 1, the second memory 600 includes a first interface 610, a refresh information storage block 620, an oscillator 630, an auto-refresh controller 640, and a second interface 650. Although not shown in FIG. 1, the second memory 600 may further include a nonvolatile memory cell array, a controller that controls an array read/write operation, and an interface for interface with the host 200. Alternatively, the second memory 600 may be provided with a volatile memory cell array and a controller for controlling an array read/write operation. If the second memory 600 is a nonvolatile memory, information stored in the refresh information storage block 620 may be stored in a nonvolatile memory cell array (not shown) of the second memory 600, and refresh information stored in the nonvolatile memory cell array may be automatically transferred to the refresh information storage block 620 at power-up. Alternatively, the stored refresh information may be provided from the host 200 in power-up mode.

The refresh information storage block 620 may be used to store information relating to the auto-refresh operation such as, for example, the auto-refresh time tREF and/or the number of times a refresh operation is performed. The oscillator 630 may be used to generate an oscillation signal POSC that is used in controlling the auto-refresh operation. The auto-refresh controller 640 generates a mode setting command and an auto-refresh command in response to the auto-refresh information from the refresh information storage block 620 and the oscillation signal POSC. For example, in response to the oscillation signal POSC, the auto-refresh controller 640 determines whether or not an auto-refresh operation should be performed for the first memory 400, and, if so, generates a refresh request signal REF_REQ. When a refresh acknowledge signal REF_ACK is input responsive to the refresh request signal REF_REQ, the auto-refresh controller 640 generates a mode setting command together with a mode setting value, and successively generates an auto-refresh command after the elapse of a predetermined time (for example, after 2-clock cycles). The mode setting value and the mode setting command generated by the auto-refresh controller 640 are transferred through the bus 1001 to the first memory 400. The mode detector 420 of the first memory 400 stores the mode setting value in response to the mode setting command. The second interface 650 outputs a refresh request signal REF_REQ as a bus request signal DREQ to the host 200, and outputs a bus acknowledge signal DACK from the host 200 as a refresh acknowledge signal REF_ACK to the auto-refresh controller 640.

Since the second memory 600 includes logic circuits it may be referred to as a "logic embedded memory."

Figure 3:
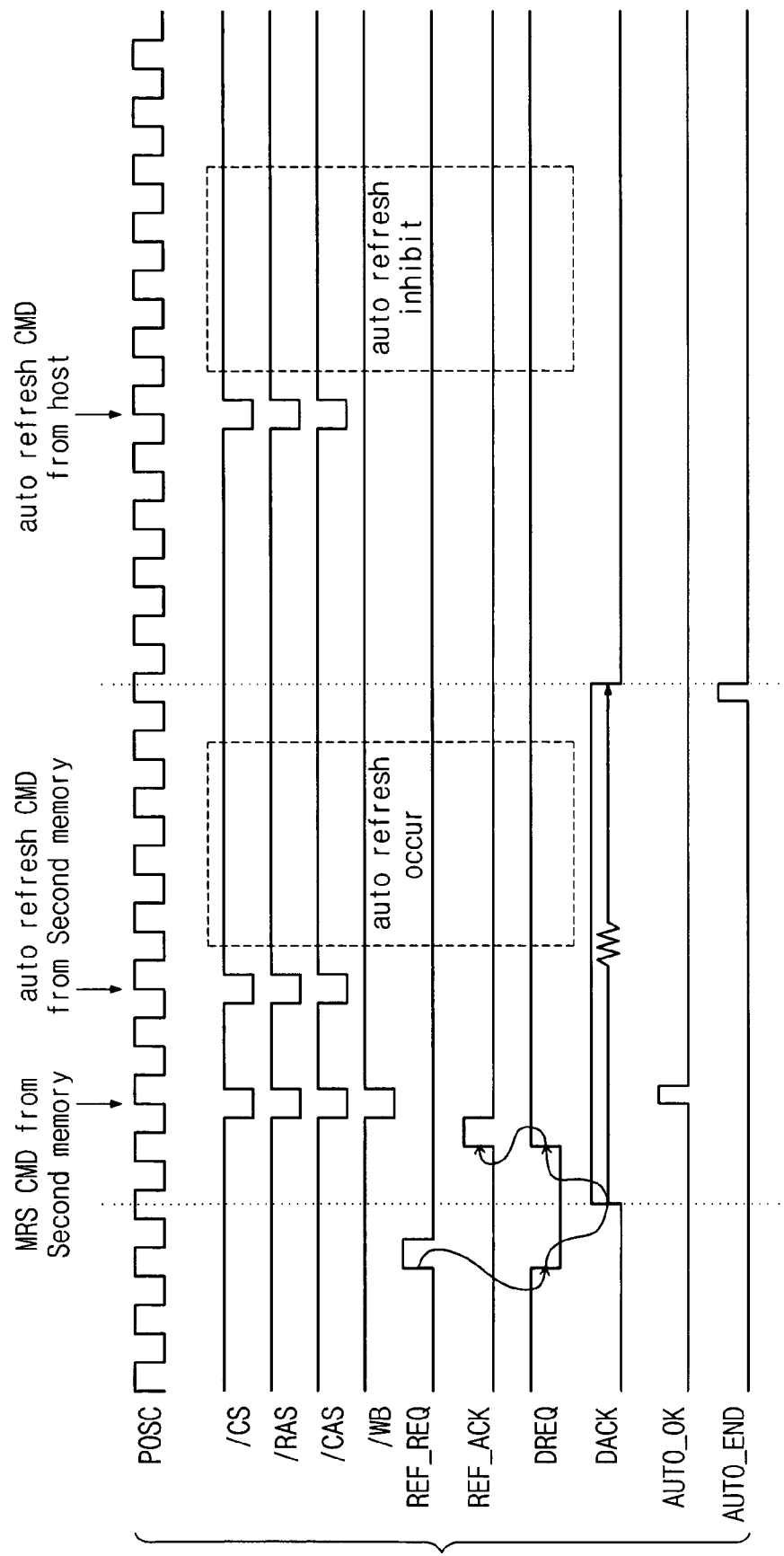
FIG. 3 is a timing diagram illustrating operations of a memory system according to embodiments of the present invention.
Figure 4:
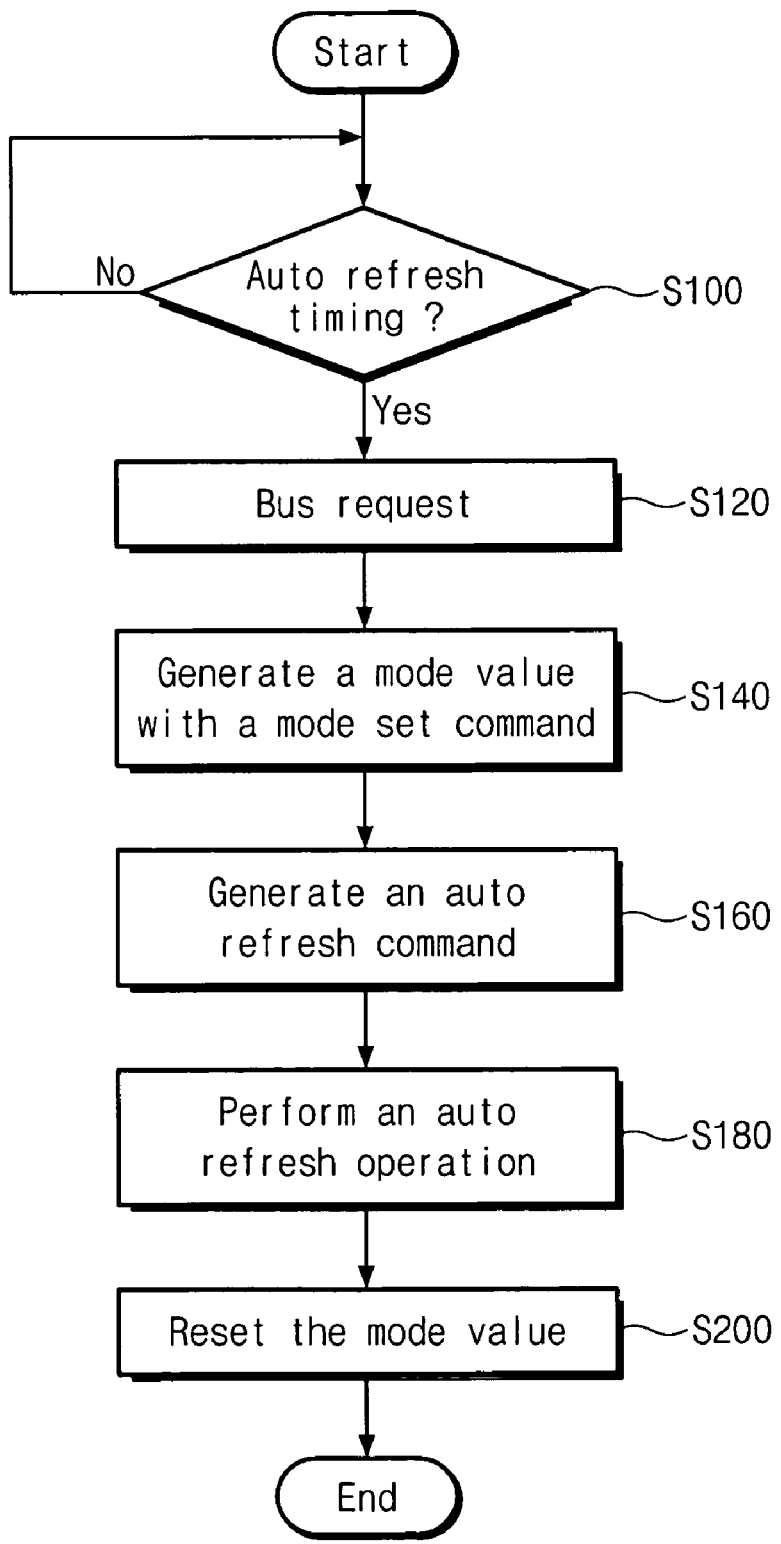
FIG. 4 is a flowchart illustrating operations of a memory system according to embodiments of the present invention.

FIG. 3 is a timing diagram illustrating an auto-refresh operation of a memory system according to certain embodiments of the present invention. FIG. 4 is a flowchart illustrating an auto-refresh operation of a memory system according to certain embodiments of the present invention.

As shown at block S100 of FIG. 4, in response to an oscillation signal POSC from the oscillator 630, the auto-refresh controller 640 of the second memory 600 determines whether or not the first memory 400 should perform an auto-refresh operation. The auto-refresh controller 640 may determine the time at which the auto-refresh operation should occur based on auto-refresh information obtained from the refresh information storage block 620. For example, the auto-refresh controller 640 may count the oscillation signal POSC to determine when the time for the next auto-refresh command occurs. When the time for performing an auto-refresh operation in the first memory 400 is reached, the second memory 600 sends a bus occupation request to the host 200 (block S120 of FIG. 4). This may be accomplished, for example, by the auto-refresh controller 640 generating and sending to the interface 650 a pulsed refresh request signal REF_REQ. The interface block 650 then sets a bus request signal DREQ to a low level in response to the refresh request signal REF_REQ. In response to this change in the bus request signal, the host 200 activates a bus acknowledge signal DACK to a high level. In response to the activated bus acknowledge signal DACK, the interface 650 generates a pulsed refresh acknowledge signal REF_ACK.

In response to the activation of the refresh acknowledge signal REF_ACK, the auto-refresh controller 640 generates a mode setting value and a mode setting command which, in embodiments of the present invention, may be implemented, for example, by setting the /CS, /WE/, /RAS and /CAS control signals to a low level (block S140 of FIG. 4). The mode setting value and the mode setting command are loaded through the first interface 610 onto the bus 1001, and the loaded mode setting value and command are transferred through the interface 410 of the first memory 400 to the mode detector 420. In response to the mode setting command, the mode detector 420 stores the mode setting value and activates a control signal AUTO_OK. Thereafter, the auto-refresh controller 640 generates an auto-refresh command (block S160 of FIG. 4), and the generated auto-refresh command is transferred through the first interface 610, the bus 1001 and the interface 410 to the command decoder 430. In response to the auto-refresh command, an auto-refresh operation is performed for the first memory 400 (block S180 of FIG. 4). Specifically, when the control signal AUTO_OK signal is activated, the command decoder 430 generates an auto-refresh enable signal AUTO_EN in a pulse form in response to the input auto-refresh command. In response to the auto-refresh enable signal AUTO_EN, memory cells of one or more rows in the memory core 440 are refreshed. After elapse of the refresh time, the command decoder 430 activates a control signal AUTO_END (block S200 of FIG. 4). This causes the initialization of the mode detector block 420. That is, the control signal AUTO_OK is deactivated. Thereafter, whenever an auto-refresh operation is required, the auto-refresh controller 640 performs the bus request operation, the mode setting operation and the auto-refresh operation in the same manner as above.

If the host 200 generates an auto-refresh command, the generated auto-refresh command is transferred to the mode detector 420 of the first memory 400. At this time, since the mode detector block 420 is not set to the above-mentioned mode setting value before the input of the auto-refresh command, the control signal AUTO_OK is maintained in a deactivated state. As a result, the command decoder 430 does not respond to the auto-refresh command provided from the host 200 as the auto-refresh command generated by the host 200 is not recognized by the first memory 400.

Consequently, memory systems according to embodiments of the present invention allow removing from the host 200 the function of generating an auto-refresh command. As a result, the hardware and software loads of the host may be reduced. The auto-refresh operation of the first memory 400 in these memory systems may be performed according to an auto-refresh command provided form the second memory 600. Accordingly, both a host supporting an auto-refresh function and a host that does not support an auto-refresh function can be used with these memory systems.

In embodiments of the present invention, the mode detector 420 may be configured to generate the control signal AUTO_OK in a pulse form. Alternatively, the mode detector block 420 may be configured to generate the control signal AUTO_OK that is activated at the input of the mode setting command and then deactivated at the activation of the control signal AUTO_END. In this case, the command decoder 430 may receive the auto-refresh command during the activation of the control signal AUTO_OK.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A method of refreshing a plurality of memory cells in a volatile memory device that is connected to a host and a non-volatile memory device by at least one bus, the method comprising:
    activating an auto-refresh mode of the volatile memory device in response to an auto-refresh mode activation command that is received from the non-volatile memory device; and then
    performing an auto-refresh operation on the plurality of memory cells in response to an auto-refresh command that is received from the non-volatile memory device;
    deactivating the auto-refresh mode of the volatile memory device in response to completion of the auto-refresh operation;
    receiving from the host a second auto-refresh command after deactivation of the auto-refresh mode but before receiving a second auto-refresh mode activation command from the non-volatile memory device; and
    not performing an auto refresh operation in response to the second auto-refresh command.

2. A method of refreshing a plurality of memory cells in a volatile memory, the method comprising:
    activating an auto-refresh mode of the volatile memory device in response to an auto-refresh mode activation command; and then
    performing an auto-refresh operation on the plurality of memory cells in response to an auto-refresh command;
    sending an occupation request for a bus from the second memory device to a host device;
    generating the auto-refresh mode activation command and the auto-refresh command within the second memory device; and
    forwarding the auto-refresh mode activation command and the auto-refresh command from the second memory device to the volatile memory device via the bus.

3. The method of claim 2, wherein forwarding the auto-refresh mode activation command and the auto-refresh command from the second memory device to the volatile memory device comprises:
    forwarding the auto-refresh mode activation command from the second memory device to a mode detector of the volatile memory device; and
    forwarding the auto-refresh command from the second memory device to a command decoder of the volatile memory device.

4. The method of claim 3, the method further comprising:
    activating a first control signal that indicates to the command decoder that the auto-refresh mode is set in response to receipt by the mode detector of the auto-refresh mode activation command; and
    wherein the command decoder initiates the auto-refresh operation in response to the activation of the first control signal and receipt of the auto-refresh command.

5. The method of claim 4, wherein the command decoder initiates the auto-refresh operation by activating a control signal that is provided to a memory core of the volatile memory device.

6. The method of claim 4, the method further comprising:
    forwarding a mode setting value from the second memory device to the mode detector; and
    storing the mode setting value in the mode detector in response to the auto-refresh mode activation command.

7. The method of claim 6, the method further comprising:
    activating a second control signal that is provided to the mode detector;
    reinitializing the stored mode setting value in the mode detector in response to the second control signal; and
    deactivating the first control signal in response to the re-initialization of the mode setting value.

8. The method of claim 2, the method further comprising:
    determining when to forward the auto-refresh mode activation command from the second memory device to the volatile memory device based at least in part on auto-refresh timing information stored in a plurality of nonvolatile memory cells of the second memory device.

9. The method of claim 8, wherein determining when to forward the auto-refresh mode activation command from the second memory device to the volatile memory device is further based on a count of the cycles of an oscillation signal provided by an oscillator included within the second memory device.

10. The method of claim 2, wherein the auto-refresh mode activation command is forwarded from the second memory device to the volatile memory device in response to receipt of an acknowledgment to the occupation request from the host.

11. The method of claim 2, wherein the auto-refresh command is forwarded from the second memory device to the volatile memory device after the auto-refresh mode activation command is forwarded from the second memory device to the volatile memory device.

12. A memory system comprising:
    a first memory device that includes a memory cell array and a first circuit that is configured to initiate an auto-refresh operation on memory cells of the memory cell array;
    an auto refresh control circuit that is configured to generate an auto-refresh mode activation command that is provided to the first memory device;
    a mode detector that is configured to set an auto-refresh mode of the first memory in response to receipt of the auto-refresh mode activation command; and
    wherein the first circuit comprises a command decoder that is configured to initiate the auto-refresh operation in response to an auto-refresh command if the auto-refresh mode is set.

13. The memory system of claim 12, wherein the auto-refresh control circuit is part of a second memory device, and wherein the second memory device further comprises:
- a nonvolatile memory array that stores information relating to the auto-refresh operation that is provided to the auto-refresh control circuit; and
- a timing signal generator that provides a timing signal to the auto-refresh control circuit.

14. The memory system of claim 13, wherein the auto-refresh control circuit is further configured to generate the auto-refresh command.

15. The memory system of claim 13, wherein the second memory device further comprises a storage block that receives the information related to the auto-refresh operation from the nonvolatile memory array, and wherein the timing signal generator comprises an oscillator.

16. The memory system of claim 14 in combination with a host and a bus, wherein the bus carries information between the host, the first memory device and the second memory device.

17. The memory system of claim 16, wherein the second memory device sends a bus occupation request to the host prior to forwarding the auto-refresh mode activation command to the first memory device.

18. The memory system of claim 17, wherein the auto-refresh control circuit is configured to sequentially generate the auto-refresh mode activation command and the auto-refresh command upon receiving an acknowledgement to the bus occupation request.

19. The memory system of claim 16, wherein the command decoder is responsive to read and write commands forwarded from the host but is only responsive to an auto-refresh command if the auto-refresh mode is set.

20. The memory system of claim 12, wherein the mode detector is configured to set the auto-refresh mode by activating a first control signal in response to receipt of the auto-refresh mode activation command.

21. The memory system of claim 20, wherein the first memory device is configured to exit the auto-refresh mode after completion of the auto-refresh operation.

22. The memory system of claim 12, wherein the first memory device is a dynamic random access memory and wherein the auto refresh control circuit is part of a second memory device that includes an array of nonvolatile memory cells.

23. A dynamic random access memory device, comprising:
- an auto-refresh control unit that is configured to set an auto-refresh mode of the dynamic random access memory device in response to an auto-refresh mode activation command and to activate an auto-refresh enable signal in response to an auto-refresh command and the setting of an auto-refresh mode;
- a memory core that is configured to perform an auto-refresh operation in response to the auto-refresh enable signal;
- wherein the auto-refresh control unit comprises a mode detector that is configured to activate a first control signal in response to the auto-refresh mode activation command and a command decoder that generates the auto-refresh enable signal in response to the auto-refresh command only if the first control signal is activated; and
- wherein the command decoder is configured to activate a second control signal when the auto-refresh operation is completed.

24. The dynamic random access memory of claim 23, wherein the mode detector stores information indicating that the auto-refresh mode is to be set in response to the auto-refresh mode activation command, and wherein the stored information is re-initialized by the mode detector in response to the activation of the second control signal.

25. A method for operating a memory system that includes a first memory device, a second memory device and a host, the method comprising:
- forwarding an auto-refresh mode activation command from the second memory device to the first memory device;
- setting an auto-refresh mode of the first memory device in response to receipt of the auto-refresh mode activation command;
- forwarding an auto-refresh command from the second memory device to the first memory device; and
- performing an auto-refresh operation on memory cells of the first memory device in response to the combination of the setting of the auto-refresh mode of the first memory device and receipt of the auto-refresh command.

26. The method of claim 25, further comprising sending a bus occupation request from the second memory device to the host, wherein the auto-refresh mode activation command is forwarded from the second memory device to the first memory device after an acknowledgement to the bus occupation request is received by the second memory device.

27. The method of claim 26, wherein the first memory device is configured to not respond to an auto-refresh command if the auto-refresh mode is not set.

28. A method for operating a memory system including a first memory, a second memory and a host, the method comprising:
- determining at the second memory that an auto-refresh operation should be performed on the first memory;
- sending a bus occupation request from the second memory to the host;
- forwarding a mode setting command and a mode setting value from the second memory to the first memory after the bus occupation request is acknowledged;
- setting an auto-refresh mode of the first memory according to the mode setting command and the mode setting value;
- forwarding an auto-refresh command from the second memory to the first memory; and
- executing the auto-refresh command at the first memory.

29. A logic embedded memory, comprising:
- an oscillator;
- an auto-refresh controller that is configured to determine based on at least an oscillation signal from the oscillator if an auto-refresh operation should be performed on a second memory device; and
- an interface to a host that is configured to forward a bus occupation request from the auto-refresh controller to the host and to forward a bus occupation request acknowledgment from the host to the auto-refresh controller,
- wherein the auto-refresh controller is further configured to generate an auto-refresh mode setting command and an auto-refresh command.

30. The logic-embedded memory of claim 29, further comprising a non-volatile memory that stores information relating to the timing of the auto-refresh operations of the second memory device that is used by the auto-refresh controller in determining if an auto-refresh operation should be performed on the second memory device.

* * * * *